United States Patent
Yun

(10) Patent No.: US 7,158,864 B2
(45) Date of Patent: Jan. 2, 2007

(54) INTERLOCK APPARATUS AND METHOD FOR SUPPLYING GAS TO A SEMICONDUCTOR MANUFACTURING DEVICE

(75) Inventor: Jong-Young Yun, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 460 days.

(21) Appl. No.: 10/687,370

(22) Filed: Oct. 15, 2003

(65) Prior Publication Data

US 2004/0092040 A1    May 13, 2004

(30) Foreign Application Priority Data

Nov. 14, 2002   (KR) ..................... 10-2002-0070912

(51) Int. Cl.
*G05D 7/00* (2006.01)
*H01L 21/02* (2006.01)

(52) U.S. Cl. ................. 700/282; 251/129.15; 118/663; 438/5; 324/546

(58) Field of Classification Search ................ 700/275, 700/282; 251/124.15; 118/720, 663; 438/5; 73/861; 324/418, 546
See application file for complete search history.

(56) References Cited

U.S. PATENT DOCUMENTS 5,119,683 A * 6/1992 Deutsch et al. ............... 73/861
5,433,344 A * 7/1995 Fulton et al. ................ 222/65

FOREIGN PATENT DOCUMENTS

JP        2000-161532    *  6/2000

* cited by examiner

*Primary Examiner*—Leo Picard
*Assistant Examiner*—Steven R. Garland
(74) *Attorney, Agent, or Firm*—Marger Johnson & McCollom, P.C.

(57) ABSTRACT

A gas supplying apparatus for a semiconductor manufacturing device has an interlock apparatus that includes at least one solenoid valve that controls the gas supply from a gas source to the semiconductor manufacturing device, a main controller configured to ouput a control signal for the semiconductor manufacturing device and a driver signal, a driver configured to apply a driving voltage to the at least one solenoid valve in response to the driver signal, and an interlocker configured to sense the open/shut state of the solenoid valves and configured to transmit an interlock signal to the main controller.

6 Claims, 3 Drawing Sheets

FIG. 1
(CONVENTIONAL)
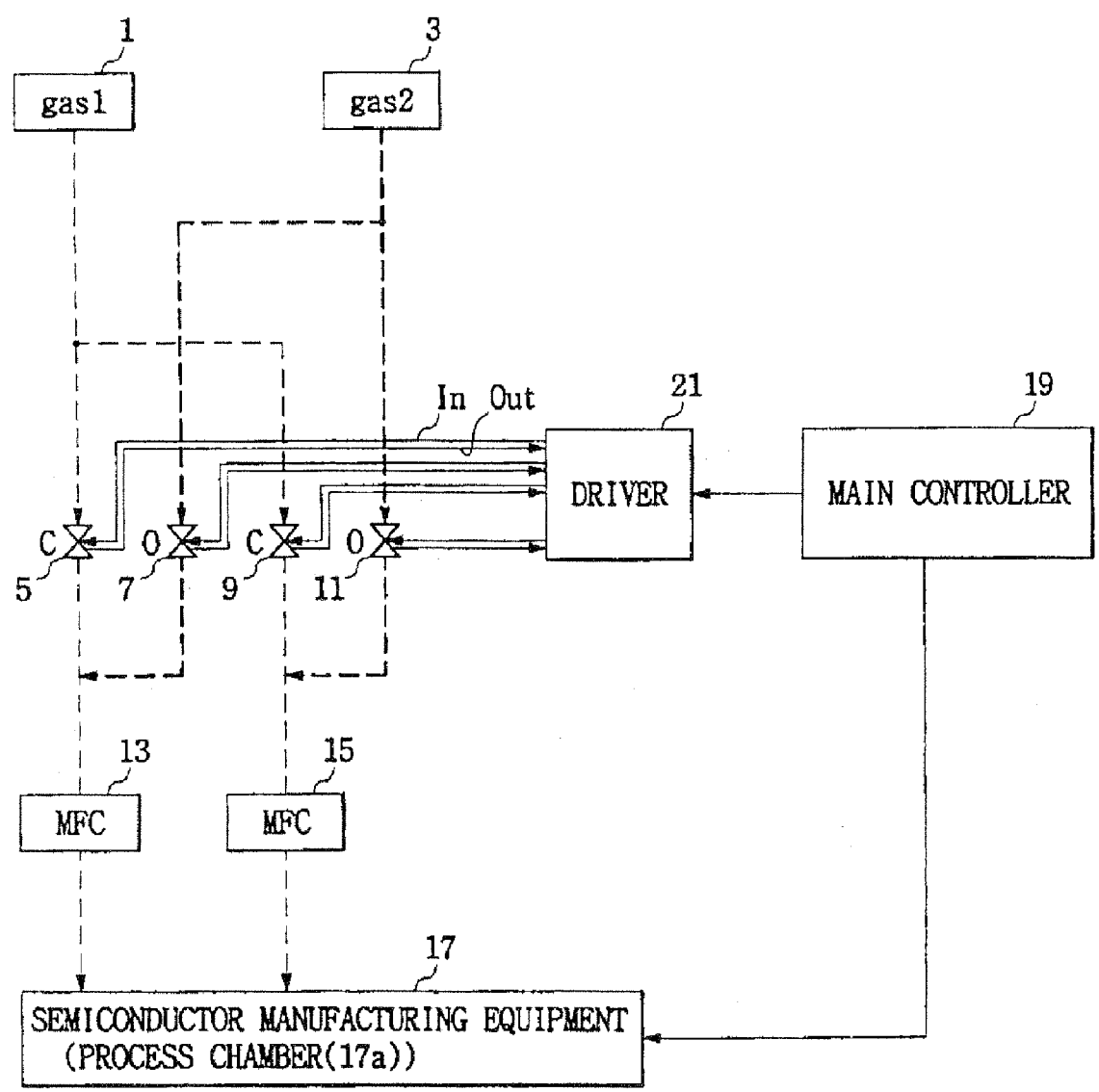

INTERLOCK APPARATUS AND METHOD FOR SUPPLYING GAS TO A SEMICONDUCTOR MANUFACTURING DEVICE

CROSS REFERENCE TO RELATED APPLICATIONS

This application claims priority from Korean Patent Application No. 2002-70912, filed on 14 Nov. 2002, the contents of which are hereby incorporated by reference in their entirety.

BACKGROUND OF THE INVENTION

1. Field of the Invention

This disclosure generally relates to a gas supplying device for semiconductor manufacturing equipment, and more specifically, to a gas supplying device for semiconductor manufacturing equipment having an interlock apparatus for generating an interlock signal when an abnormality occurs by sensing the open/shut states of solenoid valves and opening/shutting a channel of the gas supplying device.

2. Description of the Related Art

Among semiconductor device manufacturing equipment, CVD (Chemical Vapor Deposition) equipment is used to grow a variety of films. A CVD method is mainly used to form a thin film or an epitaxial layer on a semiconductor substrate by chemical reactions after dissolving gaseous compounds. Given that a process of forming the thin film is performed by supplying gas to a reaction chamber, a CVD process is differentiated from other semiconductor device manufacturing processes.

A useful CVD reaction occurs in a wide range of temperatures (approximately 100° C.~1200° C.), and plasma energy obtained by heat and RF (Radio Frequency) power, or optical energy from lasers or ultraviolet rays are used to dissolve the supplied gas. Also aiding the CVD process, the semiconductor substrate may be heated to accelerate reactions of a dissolved atom or a molecule and to control physical properties of the formed thin film.

However, when forming a thin film using the CVD method, it is common to supply more than two gases to the reaction chamber. For instance, in a process for forming a high-temperature oxide film, nitrious oxide ($N_2O$) gas and silane ($SiH_4$) gas are supplied to the reaction chamber. In a process for forming a silicon nitride film, ammonia gas ($NH_3$) and dichlorosilane ($SiCl_2H_2$) gas are supplied. And, in a process for forming a polycrystalline silicon film doped with impurities, a source gas containing impurity ions and a silicon source gas such as silane or disilane ($Si_2H_6$) gas are supplied to the reaction chamber, thereby depositing the desired thin film.

FIG. 1 is a block diagram that roughly illustrates a configuration for a conventional gas supplying device used in the CVD equipment described above. As shown in FIG. 1, different gases (gas 1, gas 2) are supplied through each corresponding line from first and second gas sources 1, 3. Channels for gas1 and gas2 are opened/shut by interrupting a first, second, third, and fourth solenoid valves 5,7,9,11, and the amount of gas delivered to the process chamber 17a of semiconductor manufacturing equipment 17 is controlled by first and second mass flow controllers 13,15.

A main controller 19 controls the semiconductor manufacturing equipment 17 where a chemical process is performed, and outputs an electrical signal that instructs driver 21 to open or shut the first through fourth solenoid valves 5, 7, 9, 11.

The driver 21 receives the electrical signal from the main controller 19, and controls the solenoid valves 5, 7, 9, 11. That is, when receiving the electrical signal from the main controller 19, a predetermined voltage is applied to the solenoid valves 5, 7, 9, 11 from a power supplying unit (not shown) of the driver 21 to operate the solenoid valves 5, 7, 9, 11, thereby opening or shutting the channels.

In FIG. 1, signal lines where an electrical signal is transmitted are displayed as solid lines, gas supplying lines are displayed as dotted lines, and input/output lines that apply the driving voltage to the solenoid valves 5, 7, 9, 11 are labeled 'In' and 'Out'.

According to the conventional art, when the driving voltages are not properly applied to the solenoid valves 5, 7, 9, 11, the driving states of the solenoid valves become abnormal, possible causing a malfunction of the valves.

For example, suppose that the first and the third solenoid valves 5, 9 maintain a closed state (indicated by "C") during normal operation, and the second and the fourth valves 7, 11 maintain an open state (indicated by "O") during normal operation. The situation where gas 1 is supplied at a higher pressure than gas 2 is described below and illustrates how problems may occur.

First, if the first or the third solenoid valve 5, 9 becomes abnormal because it does not maintain a perfectly closed state, causing the channels to be opened, the unwanted gas 1 can be supplied to the process chamber 17a of the semiconductor manufacturing equipment 17, thereby generating an unwanted process film on a processing substrate located inside the semiconductor manufacturing equipment 17. In addition, if gas 1 has a higher pressure than gas 2, and if the solenoid valve 5 or solenoid valve 9 does not maintain a closed state, there is a possibility that gas 1 will flow backward into the lines where gas 2 is supplied (thick dotted lines).

Embodiments of the invention address these and other disadvantages of the prior art.

SUMMARY OF THE INVENTION

Embodiments of the invention provide a gas supplying device for semiconductor manufacturing equipment having an interlock apparatus and interlock method for generating an interlock signal for stopping equipment operation when an abnormality occurs by sensing the open/shut states of solenoid valves, thereby reducing a process error rate.

BRIEF DESCRIPTION OF THE DRAWINGS

The above and other objects and advantages of the invention will become readily apparent from the description that follows, with reference to the accompanying drawings.

FIG. 1 is a block diagram that roughly illustrates a configuration for a conventional gas supplying device used in CVD equipment.

DETAILED DESCRIPTION OF THE INVENTION

The invention will now be described more fully hereinafter with reference to the accompanying drawings, in which an exemplary embodiment of the invention is shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Hereinafter, a configuration and an operation of a gas supplying device having an interlock apparatus according to an embodiment of the invention will be described with reference to FIG. 2 and FIG. 3.

Figure 2:
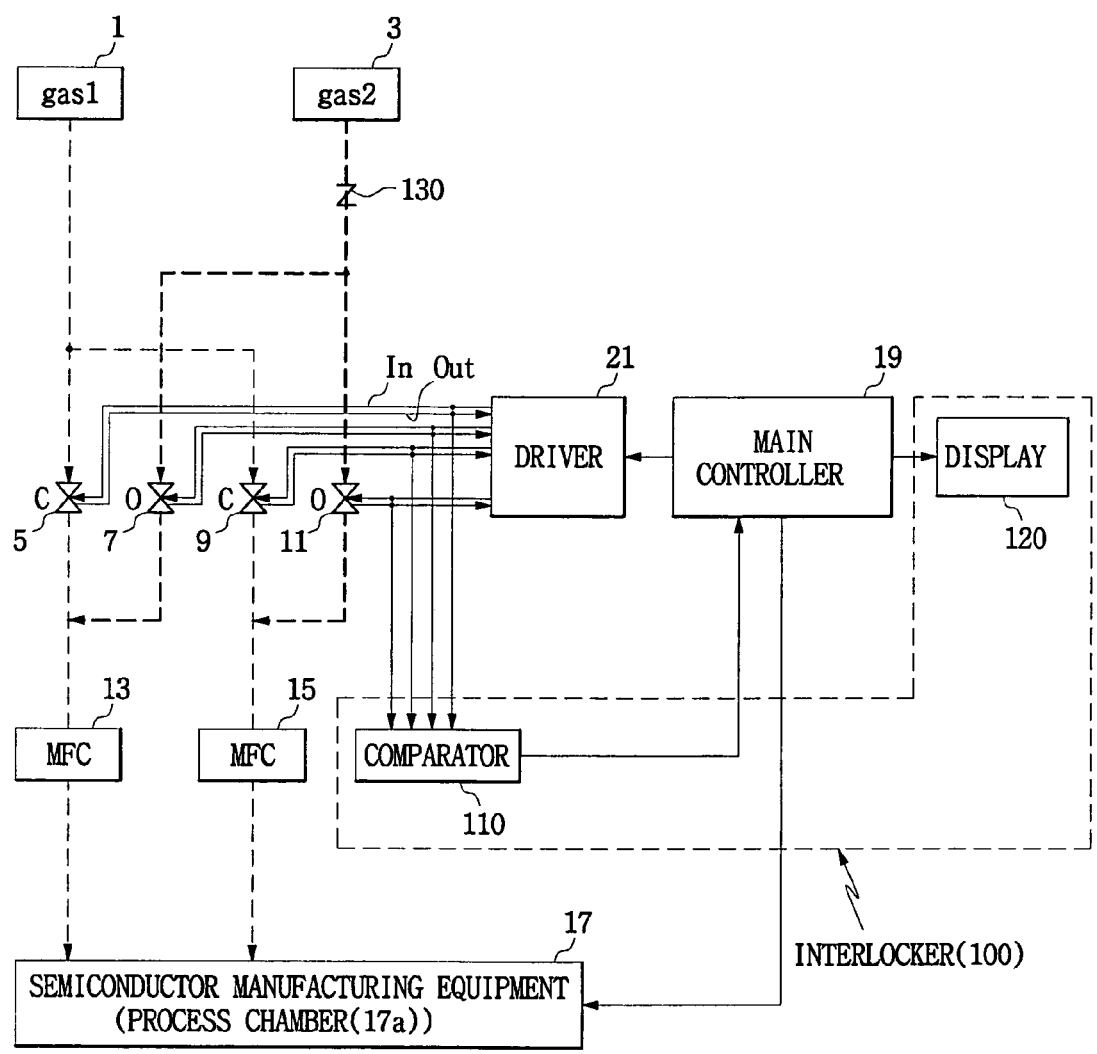
FIG. 2 is a block diagram that illustrates a configuration for a gas supplying device according to an embodiment of the invention.

Regarding FIG. 2, the presence of the same reference numerals indicate the same parts as shown in FIG. 1. Accordingly, detailed descriptions of parts that are common to FIG. 1 and FIG. 2 will be omitted to avoid repetitiveness.

FIG. 2 is different from FIG. 1 in terms of adding an interlocker 100 that senses the open/shut states of each of the solenoid valve 5, 7, 9, 11. The interlocker 100 is composed of a comparator 110 that samples the driving input/output voltages and compares them with a reference voltage value. This occurs when the driving voltages are applied to the solenoid valves 5, 7, 9, 11 by a driver 21 in response to a control signal from the main controller 19.

When data analyzed by the comparator 110 is transmitted to the main controller 19, the main controller 19 decides whether the data is in a normal range. The interlocker 100 and further includes a display 120 for informing an operator of an abnormal state when an abnormality occurs.

The display 120 may be implemented by using various types of devices that are well-known in the art, such as light bulbs, liquid crystal devices, light emitting diodes, cathode ray tubes, plasma displays, etc. Alternatively, an abnormal state could be indicated using sound, i.e., a buzzer, siren, or other audible alarm.

In FIG. 2, a voltage input line "In" and a voltage output line "Out" are coupled between the solenoid valve 5 and the driver 21. The other solenoid valves 7, 9, 11 are coupled to the driver 21 in a similar fashion, but the voltage input lines and voltage output lines are not labeled for these valves to prevent cluttering of the diagram.

A backflow cutoff valve 130 is placed between the gas source 3 for gas2 and the junction leading to the second solenoid valve 7 and the fourth solenoid valve 11.

The backflow cutoff valve 130 is a safety device for a case when channels are improperly sealed due to a wrong operation of the first solenoid valve 5 or the third solenoid valve 9. In other words, when gas 1 should be cut off by maintaining a closed state in the first solenoid valve 5 and the third solenoid valve 9, as shown in FIG. 2. If the first solenoid valve 5 or the third solenoid valve 9 is not perfectly intercepted, the backflow cutoff valve prevents high-pressure gas 1 supplied from the first gas source 1 from flowing into the second gas source 3 by moving backward through a channel where gas 2 flows. As was explained above, gas 1 has a tendency to flow towards the second gas source 3 when the supplied pressure of gas 1 is higher than that of gas 2.

Figure 3:
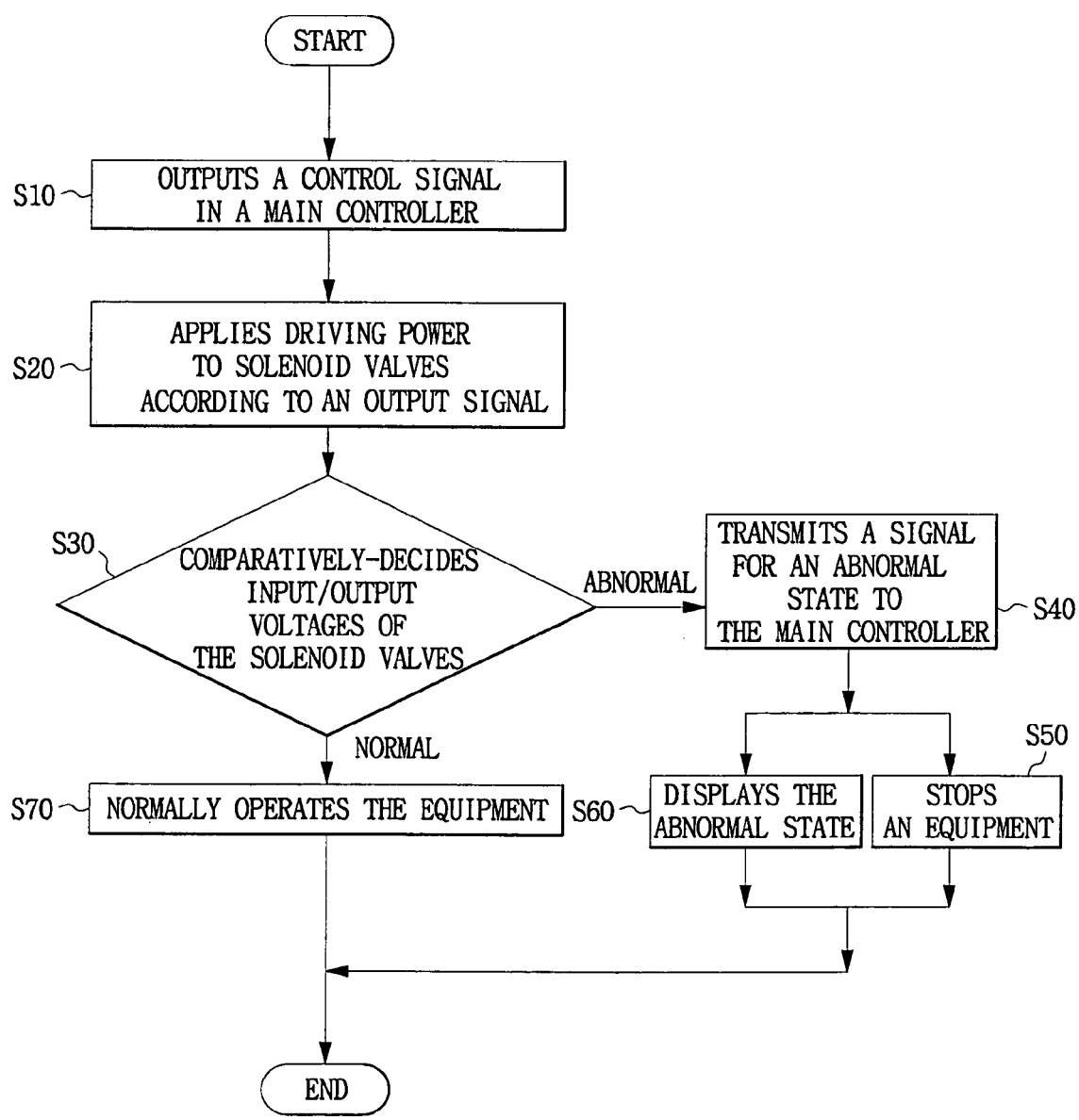
FIG. 3 is a flow chart illustrating a process for generating an interlock in the gas supplying device whose configuration is shown in FIG. 2.

FIG. 3 is a flow chart illustrating a process for generating an interlock in the gas supplying device whose configuration is shown in FIG. 2. First, in process S10, the main controller 19 outputs a control signal for opening or shutting the first, second, third, and fourth solenoid valves 5, 7, 9, 11. In process S20, the driver 21 is applies driving voltages to the solenoid valves 5, 7, 9, 11 in response to the control signal from the main controller 19, thereby causing open/shut operations to occur.

At process S30, the comparator 110, connected to the input/output lines for the driving voltages of the solenoid valves 5, 7, 9, 11 compares the input/output voltages for each solenoid valve with a reference voltage value. If the comparator 110 detects an abnormality, it signals the main controller 19 and transmits a compared result to the main controller in process S40.

In response to process S40, the main controller 19 outputs a command signal, or interlock signal, for stopping the operation of semiconductor manufacturing equipment 17 (process S50), and also outputs a command signal that causes an abnormal state indication to be displayed on display 120 (process S60). This alerts an operator to check the equipment.

Of course, if no abnormality of the voltage value is found in process S30, the semiconductor manufacturing equipment 17 continues to operate normally in process S70.

As described above, it is possible to prevent process errors from supplying an unwanted process gas to a process chamber 17a of the semiconductor manufacturing equipment 17. This is accomplished by checking the voltages applied to the solenoid valves 5, 7, 9, 11, thereby determining the open/shut states of the solenoid valves.

As described above, the invention can reduce process error rates caused by abnormal operation during gas supply, by exactly recognizing the open/shut states of the solenoid valves, and by generating an interlock signal when an abnormality occurs, thereby stopping equipment operation.

Embodiments of the invention are described below in a non-limiting way.

An embodiment of the invention includes at least one solenoid valve that supplies or intercepts gas from at least one gas source to semiconductor manufacturing equipment by open/shut operations; a main controller that outputs an electrical signal for opening/shutting the solenoid valves; a driver that applies driving voltages to the solenoid valves in response to the electrical signal from the main controller; and an interlocker that senses the open/shut states of the solenoid valves and generates an interlock signal which is transmitted to the main controller.

The interlocker includes a comparator for comparing the driving input/output voltage values with a reference voltage value and for transmitting compared results to the main controller. The interlocker also includes a display configured to display an abnormal state indication when an abnormal state occurs.

The embodiment also includes a backflow cutoff valve between a gas source and a solenoid valve, the cutoff valve preventing gas from flowing backward in a line when the pressure of the supplied gas is low.

An interlock generating method for a gas supplying device according to an embodiment of the invention includes outputting a control signal from a main controller; receiving the control signal, applying driving power to solenoid valves; comparing input/output values of the driving voltages applied to the solenoid valves with a reference voltage value; transmitting comparison data extracted in the comparison step to the main controller; and stopping the equipment through an interlock generation signal of the main controller if an abnormal state is indicated. The embodiment also includes displaying an abnormal state indication when the abnormal state occurs.

Finally, although the invention has been particularly shown and described with reference to an exemplary embodiment, various changes in form and details may be made thereto without departing from the true sprit and scope of the invention as defined by the appended claims.

The invention claimed is:

1. device with an interlock apparatus for supplying gas to a semiconductor manufacturing device, the device comprising:
   at least one solenoid valve configured to control the supply of a gas from a gas source to the semiconductor manufacturing device by open/shut operations;
   a main controller configured to output a control signal for the semiconductor manufacturing equipment and a driver signal;
   a driver configured to apply a driving voltage to the at least one solenoid valve in response to the driver signal from the main controller; and
   an interlocker configured to sense the open/shut state of the at least one solenoid valve by sampling the driving voltage and comparing it to a reference voltage, the interlocker further configured to transmit an interlock signal to the main controller.

2. The device of claim 1, wherein the interlocker comprises:
   a comparator configured to compare the driving voltage of the at least one solenoid valve with a reference voltage value, and configured to transmit a result of the comparison to the main controller.

3. The device of claim 2, further comprising:
   a display configured to display an abnormal state indicator when the result indicates an abnormal operation of the at least one solenoid valve.

4. The device of claim 2, further comprising:
   a backflow cutoff valve, coupled between the gas source and the at least one solenoid valve, configured to prevent the gas from flowing backward.

5. A device with an interlock apparatus for supplying gas to a semiconductor manufacturing device, the device comprising:
   at least one solenoid valve configured to control the supply of a gas from a gas source to the semiconductor manufacturing device by open/shut operations;
   a main controller configured to output a control signal for the semiconductor manufacturing equipment and a driver signal;
   a driver configured to apply a driving voltage to the at least one solenoid valve in response to the driver signal from the main controller;
   an interlocker configured to compare the driving voltage of the at least one solenoid valve with a reference voltage value, and configured to transmit a result of the comparison to the main controller; and
   a backflow cutoff valve that is coupled between the gas source and the at least one solenoid valve, the backflow cutoff valve configured to prevent the gas from flowing backward.

6. The device of claim 5, further comprising a display configured to display an abnormal state indicator when the result indicates an abnormal operation of the at least one solenoid valve.

* * * * *